(12) United States Patent
Makita et al.

(10) Patent No.: US 6,927,107 B1
(45) Date of Patent: Aug. 9, 2005

(54) METHOD OF PRODUCING SEMICONDUCTOR DEVICE

(75) Inventors: Naoki Makita, Nara (JP); Hiromi Sakamoto, Nara (JP); Masao Moriguchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 664 days.

(21) Appl. No.: 09/667,527

(22) Filed: Sep. 22, 2000

(30) Foreign Application Priority Data

Sep. 22, 1999 (JP) .......................................... 11-268505

(51) Int. Cl.⁷ .............................................. H01L 21/00
(52) U.S. Cl. .......................... 438/162; 438/166; 257/66
(58) Field of Search ................................ 438/162–166, 438/475–478; 257/66–72, 350–353

(56) References Cited

U.S. PATENT DOCUMENTS

| | | | | |
|---|---|---|---|---|
| 5,614,733 A | * | 3/1997 | Zhang et al. .................. | 257/66 |
| 6,180,439 B1 | * | 1/2001 | Yamazaki et al. .......... | 438/162 |

FOREIGN PATENT DOCUMENTS

| | | |
|---|---|---|
| JP | 06-244103 | 9/1994 |
| JP | 7-131034 | 5/1995 |
| JP | 7-221017 | 8/1995 |
| JP | 7-231098 | 8/1995 |
| JP | 7-297122 A | 11/1995 |
| JP | 7-335548 A | 12/1995 |
| JP | 8-22954 A | 1/1996 |
| JP | 8-264441 A | 10/1996 |
| KR | 1995-32725 A | 12/1995 |
| KR | 1996-23273 A | 7/1996 |
| TW | 404045 | 9/2000 |

OTHER PUBLICATIONS

Japanese Office Action dated Apr. 15, 2003 in corresponding Japanese application SN 11–268505.
Lee et al, "Fabrication of High–Mobility p–Channel Poly–Si Thin Film Transistors by Self–Aligned Metal–Induced Lateral Crystallization", IEEE Electron Device Letters, vol. 17, No. 8, Aug. 1996, pp. 407–409.
Bhat et al, "The Effects of MIC/MILC Interface on the Performance of MILC–TFTs", Device Research Conl., 1998, pp. 110–111.
Jin et al, "Performance of Thin–Film Transistors with Ultrathin Ni–MILC Polcrystalline Silicon Channel Layers", IEEE Electron Device Letters, vol. 20, No. 4, Apr. 1999, pp. 167–169.

* cited by examiner

*Primary Examiner*—Dung A. Le
(74) *Attorney, Agent, or Firm*—Nixon & Vanderhye P.C.

(57) ABSTRACT

In a production method of a semiconductor device, a catalyst element, e.g. Ni, is added to an amorphous silicon film, formed on a substrate with an insulating surface, for promoting crystallization of the amorphous silicon film. Thereafter, the amorphous silicon film is subjected to heat treatment to cause crystal growth therein. Next, the crystal growth is stopped in a state where minute amorphous regions (uncrystallized regions) remain in the film. Next, the silicon film is irradiated with strong light (laser light) so as to be further crystallized. As a result, a crystalline silicon film that has high quality and is excellent in uniformity is obtained.

14 Claims, 7 Drawing Sheets

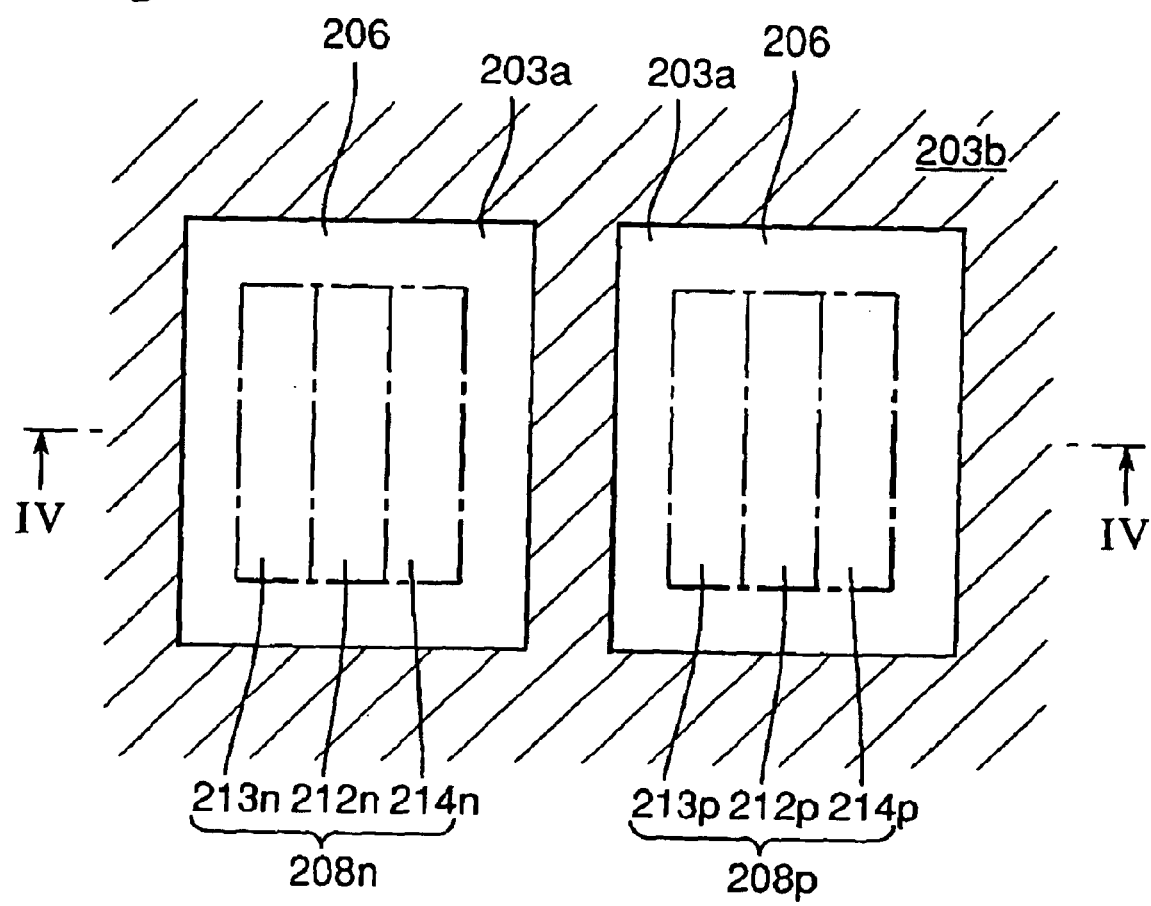

0  10  20  30 (μm)

0  10  20  30 (μm)

METHOD OF PRODUCING SEMICONDUCTOR DEVICE

BACKGROUND OF THE INVENTION

The present invention relates to a method of producing a semiconductor device, and more particularly, to a method of producing a semiconductor device in which a crystalline silicon film obtained by crystallizing an amorphous silicon film serves as an active region. In particular, the present invention is effective for a semiconductor device using thin film transistors (TFTs) formed on a substrate with an insulating surface, and can be utilized for an active matrix type liquid crystal display device, a contact type image sensor, a three-dimensional IC, and the like.

Recently, aiming to realize a large-size, high-resolution liquid crystal display, a high-speed, high-resolution contact type image sensor, a three-dimensional IC and the like, there have been trials to form a high-performance semiconductor device on an insulating substrate such as glass, or on an insulating film. In general, thin film-shaped silicon semiconductors are used for semiconductor devices to be used for these devices. The thin film-shaped silicon semiconductors are roughly classified into two types, i.e., those semiconductors made of amorphous silicon (a-Si) semiconductors and those semiconductors made of crystalline silicon semiconductors.

Amorphous silicon semiconductors, of which fabrication temperatures are low, can be easily fabricated by a vapor phase method, are superior in mass productivity, and thus they have been used most commonly. However, the amorphous semiconductors are inferior in physical properties such as electrical conductivity to silicon semiconductors having crystallinity. Therefore, the establishment of the fabrication method of semiconductor devices made of silicon semiconductors having crystallinity has been strongly desired in order to obtain improved high-speed properties. As the silicon semiconductors having crystallinity, polycrystalline silicon, microcrystalline silicon and the like have been known.

As the method of obtaining the thin film silicon semiconductors having crystallinity, the following methods (1)–(3) have been known:

(1) A method comprising directly forming a film having crystallinity at the time of film formation;
(2) A method comprising forming an amorphous semiconductor film and causing it to have crystallinity using the energy of laser light; and
(3) A method comprising forming an amorphous semiconductor film and causing it to have crystallinity by applying thermal energy.

However, in the method (1), the crystallization proceeds simultaneously with the film formation step, and thus it is essential to thicken the silicon film in order to obtain crystalline silicon with a large grain size. Accordingly, it is technically difficult to form a film having equally good physical properties of semiconductors on the whole surface of the substrate.

Further, in the method (2), since the crystallization phenomenon in the process of fusion to solidification is utilized, grain boundaries are treated appropriately a high-quality crystalline silicon film is obtained although the grain size of crystal grains is small. Taking as an example an excimer laser, which is most commonly used, no excimer lasers having sufficient stability have been obtained yet. Therefore, it is difficult to treat the whole surface of the large-area substrate uniformly, and a further improvement in the aspect of hardware is desired.

Further, the method (3) is advantageous over the above methods (1) and (2) in regard to the uniformity and stability inside the substrate. However, heat treatment extending for a long period of time, e.g., about 30 hours, at 600° C. is required. Therefore, there are such problems as long treatment time and low throughput. Further, as the means of improving crystallinity, a technique of further conducting heat treatment at a high temperature of about 1000° C. in an oxygen atmosphere has been utilized. However, an inexpensive glass substrate cannot be used in this process. Furthermore, regarding the device properties, only low properties such as a field-effect electron mobility of about 100 $cm^2$/Vs have been achieved in TFTs.

As a countermeasure against these methods, a method in which the method (3) is improved to obtain a high-quality crystalline silicon film is proposed in JP-A6-244103. This method is intended to achieve the reduction of heating temperature, the shortening of treatment time, and the improvement of crystallinity by using metal elements promoting the crystallinity of the amorphous silicon film. Specifically, a minute amount of a metal element or elements such as nickel, palladium, etc. is introduced to the surface of the amorphous silicon film and then heating is performed.

The mechanism of crystallization at a low temperature is understood as follows. The nucleation in which a metal element acts as crystal nuclei takes place at an early stage, and then the metal element serves as a catalyst to promote crystal growth, resulting in rapid proceeding of crystallization. In this sense, such a metal element is hereinafter referred to as a "catalyst element". In a crystalline silicon film that has grown with the promotion of crystallization by the catalyst element or elements, the inside of one grain thereof is constituted of a network of a number of columnar crystals, while the inside of one grain of a crystalline silicon film crystallized by the conventional solid phase growth method has a twin crystal structure. The inside of each columnar crystal is in an almost ideal single crystal state.

Further, according to JP-A-7-221017, a catalyst element is introduced into an amorphous silicon film and then heat treatment is performed for a short period of time to form crystal nuclei only. After that, the irradiation with laser light is performed to cause crystallization.

Although a silicon film crystallized using a catalyst element has good crystallinity, there are many defects in each of the crystal grains. Accordingly, as the silicon film to be used for the active layer of high-performance semiconductor devices, high-quality crystalline silicon films with fewer defects are desired. In order to improve crystallinity more, there are a method in which, after crystallization using a catalyst element, heat treatment is performed at a higher temperature (800–1100° C.) in an oxidative atmosphere, and a method in which, after crystallization using a catalyst element, the irradiation with laser light is performed. The former method (high-temperature oxidation thermal treatment) is what is called a high-temperature process, and thus an inexpensive glass substrate cannot be used.

Accordingly, premising the use of an inexpensive glass substrate, the latter method (laser irradiation) is to be used. In the crystalline silicon film obtained by introducing a catalyst element and performing a heat treatment, each crystal grain is constituted of a network of columnar crystals, each having a width of 800–1000 Å. Although the inside of the individual columnar crystals is in a single crystal state, many crystal defects such as dislocation are present inside the crystal grains due to the bend or branching of these columnar crystals. Laser irradiation is intended to make defects inside the crystal grains disappear from columnar crystal components having good crystallinity. In reality, however, it is very difficult to realize that.

In fact, when a crystalline silicon film crystallized by the promotion of catalyst elements is irradiated with laser light, there is almost no effect at a low laser power. The laser irradiation at a low laser power only retains the original crystalline state without any great improvements. On the other hand, laser irradiation at a high power resets the original crystalline state to a state similar to a state crystallized only by laser light. It is extremely difficult to form a crystalline state that is in the middle of the state obtained by low laser power and the state obtained by high laser power, and there is no margin of laser power at all.

As a result, it is difficult to improve crystallinity for formation of the active regions of TFTs by irradiating the crystalline silicon film, which has been crystallized with the aid of the catalyst element or elements, with laser light. Specifically, even if the irradiation of laser light is performed, the resulting TFTs may exhibit such properties as low electric current-driving ability that has almost no big difference from the electric current-driving ability of TFTs having a silicon film crystallized using catalyst elements alone and without laser irradiation. Alternatively, the resulting TFTs may exhibit big variation in properties although they have electric current-driving ability similar to that of those TFTs having a silicon film crystallized by laser irradiation alone. That is, even if the silicon film that has been crystallized by catalyst elements is further irradiated with laser light using the above conventional method as such, a further improvement was not achieved.

In the publication JP-A-7-221017 mentioned above, after a catalyst element is introduced into an amorphous silicon film, heat treatment is performed for a short period of time to form crystal nuclei only, and then laser irradiation is performed to crystallize the amorphous silicon film. That is, the main crystallization is performed by the irradiation with laser light, and this crystallizing method is suitable for sufficiently obtaining good results from the laser irradiation. However, it is still difficult to sufficiently control the formation of crystal nuclei. Therefore, it is difficult to use such a method in practical use.

SUMMARY OF THE INVENTION

Accordingly, an object of the present invention is to solve the above problems and provide a method of producing, on a substrate having an insulating surface, semiconductor devices having high performance and less variation in properties in a simple manner and at a high yield.

The present invention has been made by directing the inventors' attention to microstructural good crystallinity of the silicon film crystallized using a catalyst element or elements. A method of producing a semiconductor device according to one aspect of the present invention comprises:

an element adding step of adding to an amorphous silicon film a catalyst element or elements serving to promote crystallization of the amorphous silicon film, said amorphous silicon film being formed on a substrate having an insulating surface;

a first crystallization step of subjecting the amorphous silicon film to heat treatment to cause crystal growth of the amorphous silicon film, said crystal growth being stopped in a state that minute amorphous regions remain; and a second crystallization step of irradiating the amorphous silicon film, of which the crystal growth has been stopped in a state that minute amorphous regions remain, with a strong light to cause further crystallization.

According to this method, a catalyst element or elements are added to an amorphous silicon film to cause crystal growth of the amorphous silicon film by heat treatment. However, the amorphous silicon film is not completely crystallized by the heat treatment. The crystal growth is stopped in a state where minute amorphous regions (uncrystallized regions) remain. The silicon film having such minute amorphous regions mixed with crystallized regions is irradiated with strong light to cause further crystallization. With the method of the invention, it is possible to obtain a desired crystalline silicon film which has a good crystal structure of columnar network structure and of which individual crystal grains have a minute grain size.

Contrary to this, in the method that has been conventionally performed, the complete crystallization of an amorphous silicon film by catalyst elements is a premise, and then the irradiation with strong light such as laser light is performed to improve the crystallinity of the crystallized silicon film. However, this method does not exert sufficient effects, as described above.

In contrast, according to the present invention, a thin film transistor (TFT) formed using as an active region the crystalline silicon film formed by the method of the present invention exhibited improvements of the field-effect electron mobility by 2–3 times, as compared with conventionally formed TFTs. The reason for this has been under analysis and is unknown yet. However, it is presumed that, by leaving amorphous regions to some extent, these regions are preferentially fused at the time of the irradiation with strong light, and the fused regions are crystallized reflecting only good crystal components in crystallized regions.

The method according to the present invention differs from the method described in the publication JP-A7-221017 in the following respect.

That is, in the method disclosed in JP-A-7-221017, after catalyst element or elements are introduced into an amorphous silicon film, heat treatment is performed for a short period of time to form crystal nuclei only, and then the amorphous silicon film is irradiated with laser light to cause crystallization.

On the other hand, in the present invention, a catalyst element or elements are used to crystallize a great part of the amorphous film. That is, not only does nucleation take place, but also most regions are first crystallized with the aid of the catalyst element or elements. The proportion of these crystallized-regions is an extremely important factor, which will be described later. The method of the present invention is greatly different from the method of JP-A-7-221017 in which only nucleation using a catalyst element is performed before the irradiation with laser light.

According to another aspect of the present invention, there is provided a method of producing a semiconductor device comprising:

an element adding step of adding to a substrate having an insulating surface a catalyst element or elements serving to promote crystallization of an amorphous silicon film;

a silicon film formation step of forming an amorphous silicon film on the substrate to which the catalyst element or elements have been added;

a first crystallization step of subjecting the amorphous silicon film to heat treatment to cause crystal growth of the amorphous silicon film, said crystal growth being stopped in a state that minute amorphous regions remain; and a second crystallization step of irradiating the amorphous silicon film, of which the crystal growth has been stopped in a state that minute amorphous regions remain, with a strong light to cause further crystallization.

In this method, instead of adding the catalyst element or elements directly to an amorphous silicon film, the catalyst element or elements are added to a substrate having an insulating film, and then an amorphous silicon film is formed on the substrate to which the catalyst element or elements have been added. The term "substrate having an insulating surface" herein means an undercoat directly under the amorphous silicon film. When an insulating film such as a base coat is present, the catalyst element or elements are added to the insulating film. In this method, the catalyst element or elements are introduced from a lower layer to the amorphous silicon film. In spite of this, this method can achieve crystal growth similar to the crystal growth occurring when the catalyst element or elements are directly added to the amorphous silicon film. Further, if the addition of catalyst element or elements is conducted by a spin coating method and the like using a solution in which the catalyst element or elements are dissolved, stable treatment can be conducted. This is because, while the surface of the silicon film is hydrophobic, the surface of the insulating film usually has high hydrophilicity.

Then, in the same manner as in the case where the catalyst element or elements are directly added to the amorphous silicon film, the crystal growth is stopped in a state that minute amorphous regions (uncrystallized regions) remain, followed by the irradiation with strong light for further crystallization.

In the present invention, the proportion of the remaining amorphous silicon regions is a great factor in obtaining high-quality and uniform crystals. In order to control this proportion accurately, it may be the most preferable to control it depending on the amount of the catalyst element or elements to be added to the surface of either the a-Si film or the substrate having an insulating surface. That is, by increasing or decreasing the amount of the catalyst element or elements to be contained in the amorphous silicon film, the proportion of the minute amorphous regions (uncrystallized regions) remaining after the crystal growth heat treatment is controlled to be increased or decreased. The important point is that crystal growth does not depend on the heating time. Even if the heat treatment is continued for more than a fixed period of time, crystal growth does not proceed any further. That is, by using an insufficient catalyst element amount for the crystal growth in the entire silicon film, the crystal element or elements will run short after the crystal growth proceeds to a certain extent. Thus, the crystal growth does not proceed any more even if spending time. Accordingly, it is possible to control the proportion of the remaining amorphous regions after crystal growth in a stable manner and with good reproducibility and without being influenced by time. This is a very important point to the present invention. Further, the proportion of the remaining amorphous regions is not influenced by the temperature distribution inside the substrate ever at the time of temperature rising or temperature-fall, and the silicon film having undergone the first crystallization step has an extremely high uniformity within a plane.

Specifically, preferably, the amount of catalyst element or elements to be added to the surface of the amorphous silicon film or the substrate having an insulating surface may be $1\times10^{12}$–$1\times10^{13}$ atoms/cm$^2$ in terms of a surface concentration. If the amount or dose of the catalyst element or elements is less than $1\times10^{12}$ atoms/cm$^2$, then insufficient crystal growth will take place. Further, if the amount thereof is more than $1\times10^{13}$ atoms/cm$^2$, then the whole silicon film will be crystallized by the catalyst element or elements especially-when the amorphous silicon film has a film thickness of 20 nm–60 nm (this range is decided from the required suppression of off current in TFTs), and there is a high possibility that no amorphous regions remain.

The proportion of the amorphous regions remaining in the silicon film after the process of adding the catalyst element or elements and heat treatment, namely, the ratio of areas of the amorphous regions (uncrystallized regions) to the whole silicon film in a plane may be preferably 10%–50%. In other words, the proportion of the area of the crystallized regions in a plane may be in the range of 90–50%. These values have been obtained from experiments conducted by the inventors.

The 90–50% crystallized silicon film in the present invention is greatly different from the film merely formed with crystal nuclei as disclosed in JP-A-7-221017, which constitutes one originality of the present invention. FIG. 5 shows data obtained by the present inventors, which serve as the grounds for the above values of the proportions. The axis of abscissas represents the proportion of the area of the amorphous regions, namely the ratio of the area of the amorphous regions to the area of the whole silicon film after the addition of the catalyst element or elements to the amorphous silicon film and the heat treatment (but before the irradiation with strong light). The axis of ordinates represents the field-effect electron mobility of TFTs fabricated using the silicon film after irradiated with strong light, as an active region. It is found that the electron field-effect mobility of TFTs is greatly changed at the proportion of about 10% and the proportion of 50% as boundaries. Compared with the case of the irradiation with strong light at the proportion of the area of the amorphous regions of 0% (i.e., a completely crystallized state), the irradiation with strong light in the proportions of 10–50% achieves by far larger field-effect mobility. Further, when the proportion of the area of the amorphous regions is more than 50%, the electron field-effect mobility is again markedly deteriorated. In the range of more than 50%, a crystalline state obtained only by the irradiation with strong light will be included in the crystalline silicon film, thus resulting in uneven crystalline state of the silicon film as well as lowering of the mobility. The proportion of the area of the amorphous regions of 100% means a perfectly amorphous state. As obvious from the above, the area ratio of the amorphous silicon regions to the whole film after the heat treatment, namely, before the irradiation with strong light may be, preferably, 10–50%.

More preferably, the above area ratio may be in the range of 20–40%. The reason is that, as is seen from FIG. 5, if the area ratio is in the range, substantially no difference in the field-effect mobility is observed and highest values are obtainable. This indicates that, even if the proportion of the amorphous regions after the addition of the catalyst element or elements and heat-treatment (before the irradiation with strong light) is a little varied, the variation in properties will not appear. Therefore, the above range of the area ratio is regarded as a condition that can stably maintain high mobility.

As described above, the proportion of the amorphous regions in the silicon film after the heat treatment (before the irradiation with strong light) is an important factor to the present invention. In addition to this, the size of the individual amorphous regions (uncrystallized regions) is another point of the present invention. The silicon film at this stage is in a state where amorphous regions (uncrystallized regions) are interspersed with crystallized regions. The effects of the present invention are greatly influenced by what the sizes of the individual remaining amorphous regions are. That is, it is presumed that, in the later crystallization by the irradiation with strong light, amorphous regions are preferentially fused and these regions are crystallized while reflecting good crystal components in the crystallized regions. However, in the regions where the size of the remaining amorphous regions is large, the amorphous regions are solidified and crystallized before inheriting good crystal components from the crystallized regions. As a result, such regions result in a state similar to that of the crystalline silicon film that has been crystallized only by the irradiation with strong light. Accordingly, if the individual amorphous regions are large, the resulting silicon film will show large scattering in crystallinity within a plane. The boundary for it is about 5 μm. In the silicon after the heat treatment (but before the irradiation with strong light), amorphous regions (uncrystallized regions) are interspersed with crystallized regions, and, in one embodiment, the individual amorphous regions have a planar size of 5 μm or smaller. If the planar size is not more than 5 μm, at the time of the irradiation with strong light, the amorphous regions can be crystallized in a state where good crystallinity in the crystallized regions adjacent to the amorphous regions is reflected. The term "planar size" herein means a length in a shorter side (minor axis) direction if the remaining amorphous region is compared to a rectangle or an ellipse, while the term "planar size" means a diameter if the amorphous region is compared to a circle. That is, the length of the amorphous region on the shorter side both ends of which are sandwiched between crystallized regions is important.

As described above, it is important to reduce in size of the remaining amorphous regions and distribute these regions uniformly in the substrate. In order to achieve this state, the individual crystal grains in the crystallized regions should be formed to be small in size at the time of heating for crystallization using catalyst elements. Specifically, in one embodiment, the crystallized regions are each constituted of polycrystalline silicon in which individual crystal grains have a grain size of 5 μm or less. If the grain size of the individual crystal grains is substantially not more than 5 μm, it is possible to form the individual amorphous regions (uncrystallized regions) so as to have a size of substantially not more than 5 μm. Generally, the individual crystal grains differ from one another in crystal orientation and/or growth direction, and grain boundaries are formed in some part of the crystallized regions. These factors would become a great cause of the variation in properties of semiconductor devices. The present invention aims to stably fabricate high-performance semiconductor devices with good uniformity and reproducibility. In order to decrease the variation in properties, it is effective to make the grain size of the individual grains smaller than the size of the channel regions of the individual thin film transistors. If the grain size is not more than 5 μm, variation in the properties of the TFT substrates produced will be in an acceptable range.

In order to stably form on the whole surface of the substrate a silicon film in which the grains have a grain size of as small as 5 μm or less and the individual remaining amorphous regions have also a size of as small as 5 μm or less, in one embodiment, the amorphous silicon film contains hydrogen and a concentration of hydrogen in this film is about 3–25 atomic %. The reason for adopting such a hydrogen concentration is as follows.

FIG. 6 shows the relationship between the hydrogen concentration in the amorphous silicon film at an early stage and the grain size of the crystalline silicon film that has been crystallized using catalyst elements, which relationship has been obtained through experiments by the inventors. In the experiments, nickel was used as a catalyst element. The nickel concentration in each sample was adjusted to be the same value ($5 \times 10^{12}$ atoms/cm$^2$ in terms of the surface concentration after the addition).

Nevertheless, as is seen from FIG. 6, when the hydrogen concentration was reduced to a certain value or lower, the grain size abruptly increased. A threshold of the abrupt increase of the grain size is about 3 atomic %

FIG. 7A shows an optical microphotograph of a surface of a silicon film after the heating process where an amorphous silicon film containing hydrogen at the concentration of below 3 atomic % was used. Extremely large crystal grains having a grain size of more than 30 μm are observed. In addition, the remaining amorphous regions each have a large size. On the other hand, FIG. 7B shows an optical microphotograph of a surface of a silicon film after the heating process where an amorphous silicon film containing hydrogen at the concentration of about 10 atomic % was used. Although the microphotograph of FIG. 7B is the same magnification as FIG. 7A, crystal grains are too small to confirm their grain size by an optical microscope. According to the observation using a TEM (transmission electron microscope), the grain size was about 1–2 μm. As is also seen from the curve in FIG. 6, the states of crystal growth shown in FIGS. 7A and 7B are completely different in growth mode rather than they merely reflect the change of the hydrogen concentration. A threshold that switches the growth mode between these is 3–5 atomic percent in terms of the hydrogen concentration. When the hydrogen concentration is not more than this threshold value, the nucleation density is extremely small, and the crystal growth from each of the crystal nuclei is big, thus forming big crystal grains as shown in FIG. 7A. In contrast, when the hydrogen concentration is more than the above threshold value, the nucleation density becomes high, and the crystal growth from each of the crystal nuclei is little, resulting in minute crystal grains as shown in FIG. 7B. In both cases, in accordance with the concentration of catalyst elements to be added, the nucleation density is changed, but such a change is within the respective modes. A conclusive difference in crystal growth mode due to the difference in hydrogen concentration is observed at any concentrations of catalyst elements.

The mechanism of this phenomenon has not been understood clearly. However, the following explanation about the mechanism would be possible, although it is just a supposition.

That is, catalyst element or elements have already been diffused in a metallic state in the amorphous silicon film before the crystallization of the amorphous silicon film (in the middle of temperature rising). The crystallization of the amorphous silicon film occurs at the time that the catalyst element or elements have reacted with amorphous silicon and formed silicide. In the case of an amorphous silicon film of a low hydrogen concentration, judging also from the nucleation, the atoms of the added catalyst element would migrate in the amorphous silicon film and gather to sporadically form clusters of a certain size to cause crystallization. Then, those clusters would serve as nuclei to form big crystal grains. Accordingly, almost no catalyst elements would be present between adjacent nuclei, where new nucleation would not occur.

Contrary to this, when a large amount of hydrogen is contained in the amorphous silicon film, hydrogen is presumed to prevent the migration of atoms of the catalyst element or elements. Then, the added catalyst element or elements would contribute to the crystallization while remaining in the original added state. This would result in a uniform distribution of crystal nuclei. Since the amount of the catalyst element in each of the crystal nuclei is small, minute crystal grains are formed on the whole surface of the substrate without growing to be bigger.

As described above, preferably, the amorphous silicon film may contain hydrogen, and the hydrogen concentration in the film may be at least 3 atomic percent. On the other hand, if the hydrogen concentration in the amorphous film is excessively high, the silicon film would disadvantageously peel off the substrate during the heat treatment for the crystallization of the amorphous silicon film, due to a large amount of hydrogen leaving the inside of the film. From the viewpoint of at least preventing such peeling, the hydrogen concentration in the amorphous film may be, preferably, 25 atomic percent or lower.

As the method of actually forming such an amorphous silicon film containing hydrogen, a plasma CVD method in which the heating temperature is not more than 400° C. may be used. The plasma CVD method in which the heating temperature is not more than 400° C. enables the formation of the amorphous silicon film that contains the hydrogen almost evenly distributed at a concentration within the above range. In addition, this method is also applicable to a large-area substrate with good reproducibility.

In one embodiment, the heat treatment in the first crystallization step is carried out at a temperature at which there occurs no spontaneous generation of crystal nuclei derived from the amorphous silicon film itself, but occurs generation of crystal nuclei derived only from the catalyst element or elements, and at which the crystal growth proceeds only with the aid of the catalyst element or elements.

Since the present invention utilizes a good crystalline state in microstructural point of view in the regions crystallized using catalyst elements, the heat-treatment for the crystallization of the amorphous silicon film should be performed at at least a temperature at which the nucleation attributed to the catalyst element takes place and the crystal growth attributed to the catalyst element proceeds. However, if the temperature at this time is too high, the spontaneous nuclear generation of the, amorphous silicon film occurs and the crystal growth starts. Because the spontaneously generated nuclei do-not depend on the catalyst element or elements, the crystalline state thereof becomes a twin crystal structure having a lot of defects as in those silicon films obtained by solid phase growth without the use of catalyst elements.

If such a crystalline state having low crystallinity as above is present in the remaining amorphous regions after the crystal growth by catalyst elements has been stopped, the crystalline silicon, film obtained after the later irradiation with the strong light would contain a mixture of regions that have been crystallized by taking over or succeeding the crystallinity of the regions crystallized with the aid of the catalyst element or elements, and regions that have grown by taking over the spontaneous solid phase growth crystalline state. Naturally, in this case, performance of semiconductor devices is deteriorated and variation in properties between devices becomes wide. Furthermore, if the heating temperature is much higher, the amorphous regions to be left will be filled with spontaneously grown crystalline regions, resulting in a state where the whole surface has been crystallized at the end of the heat-treatment. This state completely deviates from the feature of the invention that crystal growth is stopped while leaving amorphous regions.

Preferably, the heat treatment temperature in the first crystallization step may be set in the range of 520–570° C. This is because the temperature at which the crystal growth of the amorphous silicon film attributed to the catalyst elements begins to take place is about 520° C., while the temperature at which the spontaneous nucleation of the amorphous silicon film without using catalyst elements is about 570° C. The latter may be greatly influenced by the film quality of the amorphous silicon film, but considering the amorphous silicon film obtained by the plasma CVD method effective for the present invention, the upper limit of the heating temperature is approximately the above value.

Incidentally, concerning the strong light irradiation step (the second crystallization step), if the intensity of light at this time is low, the silicon film is hardly fused, so that the remaining amorphous regions will suffer from insufficient crystal growth reflecting the crystallinity of the crystallized regions. On the other hand, if the intensity of light is excessively high, the crystallinity in the crystallized regions obtained by the addition of catalyst elements will be completely lost (namely, reset). As a result, the whole surface of the crystalline silicon film will become similar to that obtained by the conventional crystallization only by the laser light. For that reason, not only is the performance deteriorated, but also a problem of nonuniformity inherent in the crystallization with laser light occurs. Accordingly, the intensity of light for irradiation is very important. It is required that the irradiation be performed at such an intensity range in which the amorphous regions are crystallized reflecting the already crystallized regions and also the original crystallinity in the crystallized regions is not lost. If the irradiation is performed out of the above intensity range, the effects of the present invention will be markedly impaired.

As the strong light, an excimer laser light having a wavelength of not more than 400 nm may be used most suitably. When the wavelength is not more than 400 nm, the laser light has an extremely high absorption coefficient to a silicon film. Thus it is possible to heat only a silicon film instantly without thermally damaging a glass substrate. Further, the excimer laser light has a large output power and is suitable for treating a large-area substrate. Among others, a XeCl excimer laser light with a wavelength of 308 nm may be the most suitable for the use for mass-produced apparatuses. This is because the XeCl excimer laser has a large output power, so that it is, possible to make the beam size large when irradiating the substrate and thus it is easy to cope with a large-area substrate. Also, it has a relatively stable output. This is why the XeCl excimer laser of a wavelength of 308 nm is the most suitable for mass-produced apparatuses.

In one embodiment, the irradiation step is performed using the excimer laser such that a surface energy density at a surface of the silicon film is 200–450 mJ/cm$^2$.

If the surface energy density of the laser light is smaller than 200 mJ/cm$^2$, the silicon film will hardly be fused, and the crystal growth of the remaining amorphous regions reflecting the crystallinity of the crystallized regions will not sufficiently proceed. On the other hand, if the surface energy density of the laser light is larger than 450 mJ/cm$^2$, the crystallinity of the crystallized regions obtained by the addition of the catalyst element or elements will be lost completely (namely, reset). As a result, the whole surface of the resultant crystalline silicon film is similar to that obtained by the conventional crystallization using laser light. For that reason, not only is the, performance of the semiconductor device deteriorated, but also a problem of nonuniformity inherent in the crystallization with laser light occurs. As is obvious, the above energy density range corresponds to a range in which the above amorphous regions are crystallized reflecting the crystallinity of the crystallized regions, while the original crystallinity of; the crystallized regions is not lost.

As the catalyst elements that can be used for the present invention, Ni, Co, Pd, Pt, Cu, Ag, Au, In, Sn, Al and Sb can be mentioned. One or plural elements selected from these elements exert an effect of promoting the crystallization even in a minute amount. Among these, the most remarkable effect can be obtained when using Ni in particular. Concerning the reason thereof, the following model is presumed: A catalyst element does not act independently but bonds to silicon to be silicified whereby acting on the crystal growth. The crystal structure at this time acts like a kind of a template at the time of the crystallization of the amorphous silicon film, thus promoting the crystallization of the amorphous silicon film. An Ni atom forms a silicide ($NiSi_2$) together with two Si atoms. The silicide $NiSi_2$ shows a fluorite type crystal structure, and the crystal structure is very much alike the diamond structure of single-crystal silicon. Moreover, $NiSi_2$ has a lattice constant of 5.406 Å, which is very close to the lattice constant of the diamond structure of single crystal silicon of 5.430 Å. Accordingly, the silicide $NiSi_2$ is the best as a template for crystallizing the amorphous silicon film. As the catalyst element to be used in the present invention, Ni is most preferable.

One of conspicuous characteristics of the present invention resides in performing the crystallization of the amorphous silicon film using a catalyst element or elements. Even though the dose thereof in a trace, the presence per se of such a metal element in the semiconductor film is not good. Therefore, the method of producing a semiconductor device of the invention may further comprise, after utilizing the catalyst element or elements for the crystallization treatment of the amorphous silicon film, a catalyst element-migrating step of causing most of atoms of the catalyst element or elements remaining in the silicon film to migrate to regions other than an active (channel) region of the semiconductor device. As the method of causing the catalyst element atoms to migrate, the following one is effective. That is, after crystallizing the amorphous silicon film, the regions of the silicon film other than the region where a semiconductor device is to be formed is ion-doped with phosphorus, and then a heat treatment is performed at a temperature of about 600° C. By so doing, atoms of the catalyst element or elements, e.g. Ni, that are present at least in the form of silicide migrates to the regions doped with phosphorus. After that, these regions are removed before forming a semiconductor device. In this method, all the atoms of the catalyst element or elements diffused to silicon cannot be removed, but the catalyst element concentration in the silicon film is markedly reduced to a level corresponding to a solid-soluble limit. However, the above catalyst element-migrating step should be conducted after the irradiation of the silicon film with strong light. The reason for that is as follows. If this step is conducted before the irradiation of the silicon film with strong light, the heat treatment at this step will cause the whole silicon film to be crystallized by the crystal nuclei obtained not by the effect of catalyst elements but by the spontaneous generation. As a result, one of the features of the present invention that the irradiation with strong light is performed in a state where amorphous regions remain will be canceled.

Other objects, features and advantages of the present invention will be obvious from the following description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a plan view showing the scheme of the production method of a semiconductor device according to a second embodiment of the present invention;

DETAILED DESCRIPTION OF THE PREFERRED EMBODIMENTS

[First Embodiment]

The first embodiment of the manufacturing method of a semiconductor device of the present invention will be described. In the first embodiment, the present invention is utilized in a process for fabricating N-type TFTs on a glass substrate. The TFTs that are fabricated in this embodiment can be used not only for a driver circuit and pixels of an active matrix type liquid crystal display device, but also as elements constituting a thin film integrated circuit. In this embodiment, as a representative of these, pixel-driving TFTs of an active matrix substrate for a liquid crystal display device, which particularly requires uniform fabrication of several hundred thousands to several millions of N-type TFTs, are taken and described.

Plan views of pixel TFTs on the active matrix substrate being produced in the first embodiment are shown in FIGS. 1A, 1B, 1C, 1D and 1E according to the order of the fabrication steps. In reality, the active matrix substrate has at least several hundred thousands of TFTs as described above, but in FIGS. 1A–1E the active matrix substrate is shown simplified to 12 TFTs of three rows by four columns. Further, in FIGS. 2A, 2B, 2C, 2D, 2E and 2F, the cross section of one of the TFTs in FIGS. 1A–1E at each of the fabrication steps is shown according to the order of the steps.

Figure 2A:
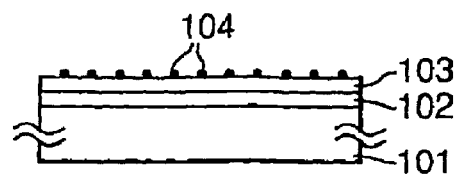
FIGS. 2A, 2B, 2C, 2D, 2E and 2F are sectional views sequentially showing the fabrication steps according to the first embodiment of the present invention.

First, as shown in FIG. 2A, on a glass substrate 101, an undercoat film 102 of silicon oxide is formed to a thickness of about 300–500 nm by, for example, a sputtering method. The undercoat film 102 made of silicon oxide is provided to prevent the diffusion of impurities from the glass substrate 101. Next, an intrinsic (I type) amorphous silicon (a-Si) film 103 having a thickness of 20–60 nm, for example 30 nm, is formed by a plasma CVD method. At this time, the temperature at which the substrate is heated is preferably not more than 400° C. In an example of this embodiment, the temperature was set to 300° C. Further, a parallel plate plasma CVD system was used as a CVD system, and monosilane (SiH$_4$) and hydrogen (H$_2$) gasses were used as source gasses. The power density of RF power was set in the range between 10 and 100 mW/cm$^2$ (e.g., 80 mW/cm$^2$), which is relatively low, and the deposition rate at this time was set to about 50 nm/minute. The concentration of hydrogen in the amorphous silicon film 103 thus obtained was 10–15 atomic %.

Next, a minute amount of nickel 104 is added to the surface of the a-Si film 103. In the example, the addition of the nickel 104 in a minute amount was performed by retaining on the a-Si film 103 a solution in which nickel was dissolved, and uniformly spreading the solution on the substrate 101 with a spinner, followed by drying. In the example of the first embodiment, nickel acetate was used as a solute, and ethanol was used as a solvent. The concentration of nickel in the solution was adjusted to 1 ppm. The concentration of the nickel thus added to the a-Si film was measured by the total reflection of X-ray fluorescence analysis method (TRXRF) and found to be about $5\times10^{12}$ atoms/cm$^2$. Then, the resultant substrate is subjected to heat treatment under an inert atmosphere, e.g., a nitrogen atmosphere. In this heat treatment, first, dehydrogenation treatment is carried out for separating the hydrogen from the a-Si film 103 in the middle of temperature rising, and then, the crystallization of the a-Si film 103 is carried out at an elevated temperature. Specifically, as a first step of the heat treatment, annealing is conducted at a temperature in the range of 450–520° C. for one to two hours. As a second step of the heat treatment, annealing is conducted at a temperature in the range of 520–570° C. for two to eight hours. In the example of the first embodiment, after carrying out a heat treatment at 500° C. for one hour, a heat treatment was carried out at 550° C. for four hours. In this heat treatment, the silicification of the nickel added to the surface of the a-Si film 103 occurs. Then, the crystallization of the a-Si film 103 proceeds using the silicified nickel as nuclei.

Figure 7A:
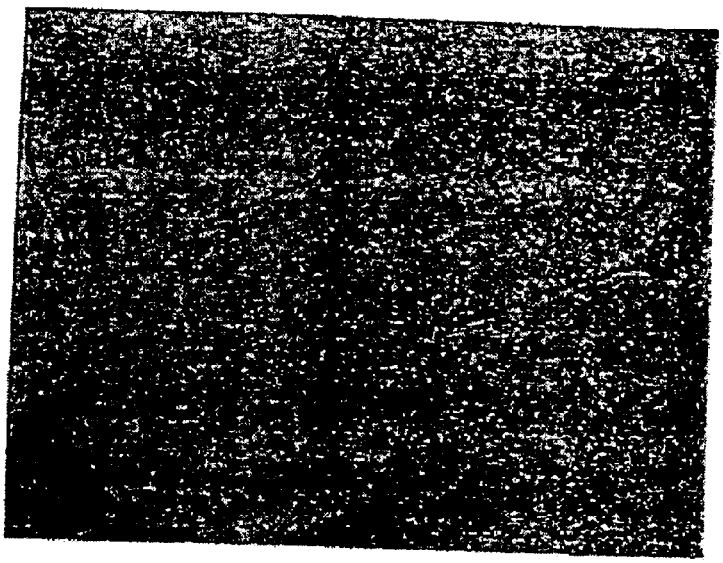
FIG. 7A shows a microphotograph of a surface of a silicon film of a comparison example.
Figure 7B:
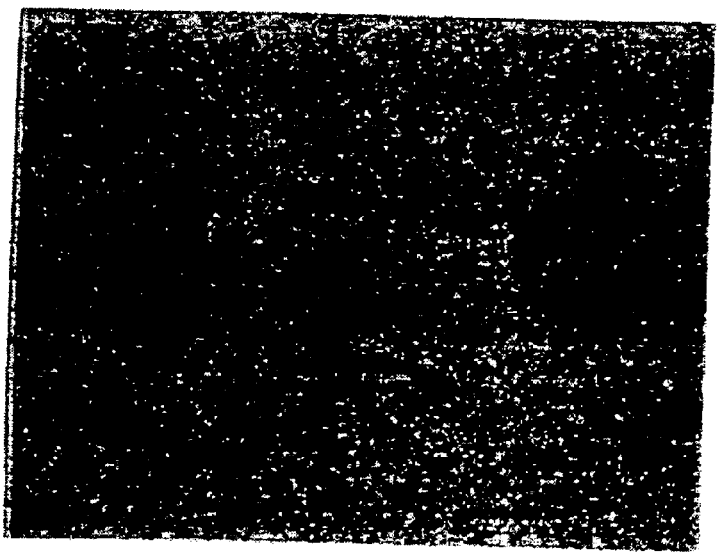
FIG. 7B shows a photograph of a surface of a silicon film a ccording to the present invention.

However, since the amount of catalyst element is not sufficient to crystallize the a-Si film completely, the crystal growth stops at a certain point. Spontaneous crystal growth of the silicon film does not occur at a temperature of below 570° C., and thus the silicon film remains amorphous in the uncrystallized regions that the crystal growth does not reach. As a result, in the example, a silicon film obtained after the heat treatment at 550° C. for four hours was in a mixed state of amorphous regions and crystallized regions. Specifically, a state as shown in FIG. 7B was obtained. The area ratio of the amorphous regions to the whole silicon film was about 30%. Further, the size of each of the amorphous regions was max. 2 µm. Further, the average grain size of the individual crystal grains in the crystallized regions was about 1–1.5 Sm.

Figure 2B:
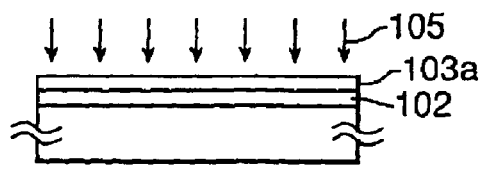

Next, as shown in FIG. 2B, by the irradiation of the silicon film 103 with laser light 105, the silicon film 103 is further crystallized to obtain a crystalline silicon film 103a. At this time, a XeCl excimer laser (a wavelength of 308 nm, a pulse width of 40 nsec) was used in the example as the laser light. The irradiation conditions of the laser light were as follows: the substrate was heated to 200–450° C. (400° C. in this case) at the time of the irradiation and then irradiated at an energy density of 200–450 mJ/cm$^2$ (350 mJ/cm$^2$ in this case). The laser was designed so that the beam size on the surface of the substrate 101 would be 150 mm×1 mm in an elongated shape. Scanning was performed at a step width of 0.05 mm in a direction perpendicular to the longitudinal direction of the laser beam. This means that one optional point on the silicon film 103 is irradiated with the laser light 20 times in total. By the laser irradiation, amorphous regions remaining in the silicon film are fused preferentially and crystallized reflecting only good crystal components in the crystallized regions, whereby the entire silicon film become crystalline.

Figure 2C:
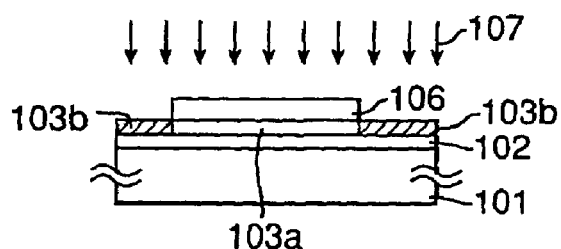

Next, as shown in FIG. 2C, an insulating thin film such as a silicon oxide or silicon nitride film is deposited on the crystalline silicon film 103a. Then patterning is performed to form a mask 106. In the example of the first embodiment, a silicon oxide film was used as ly the mask 106. Also, TEOS was used as a source gas. TEOS was decomposed with oxygen and deposited by the RF plasma CVD method. The thickness of the mask 106 is preferably from 100–400 nm. In this embodiment, the thickness of the silicon oxide film was set to 150 nm. When seen from above, the substrate at this time displays a state where parts of the crystalline silicon film 103a are covered by the mask pattern 106 like islands.

Figure 1A:
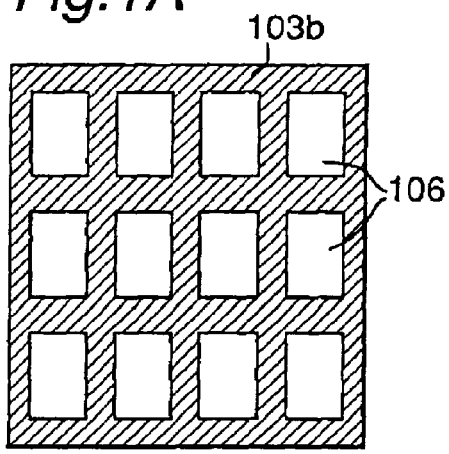
FIGS. 1A, 1B, 1C, 1D and 1E are plan views sequentially showing the fabrication steps according to a first embodiment of the production method of a semiconductor device of the present invention.
Figure 1D:
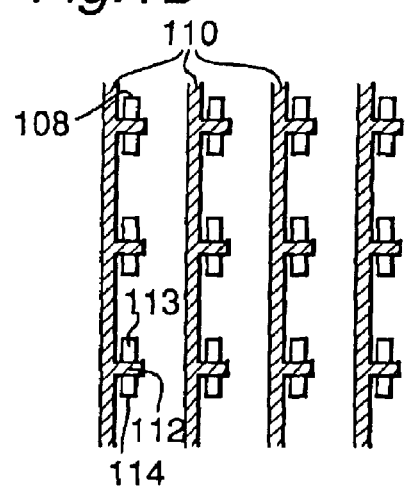
Figure 1B:
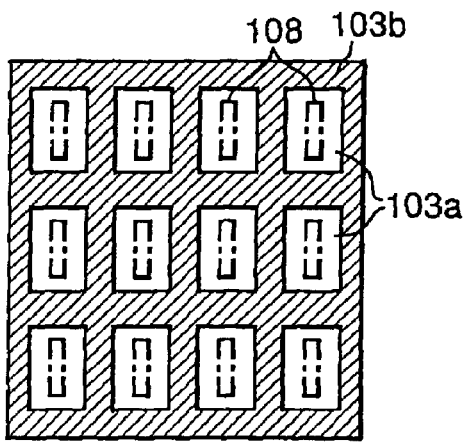
Figure 1E:
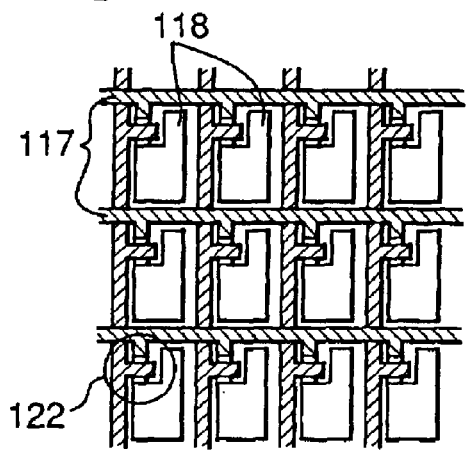

Next, in this state, as shown in FIG. 2C, ion doping is performed with phosphorus 107 on the whole surface of the substrate 101 from above. At this time, the doping conditions of the phosphorus 107 were as follows: an acceleration voltage of 5–10 kV, a dose of $5\times10^{15}$–$1\times10^{16}$ cm$^{-2}$. By this step, phosphorus is implanted in exposed regions of the crystalline silicon film 103a, whereby phosphorus-doped crystalline silicon regions 103b are formed. On the other hand, the region covered by the mask 106 is not doped with phosphorus. When seen from above, the substrate at this time is in a state as shown in FIG. 1A. In FIG. 1B showing the next step, future TFT active regions 108 are shown by broken line in order to make clear the positional relationship among the future TFT active regions, the regions covered by the mask 106, and the phosphorus-implanted regions 103b. Portions of the crystalline silicon film corresponding to the TFT active regions 108 to be formed later are completely covered by the mask 106 at this stage. It is to be noted that the hatched portions in FIGS. 1A, 1B and 2C indicate the phosphorus-doped regions 103b.

In this state, the resulting silicon film is subjected to heat treatment in an inert atmosphere, for example, a nitrogen atmosphere, at a temperature of 580–650° C. for several hours to several tens hours. In the first embodiment, as an example, heat treatment was conducted at 600° C. for 12 hours. In this heat treatment, the phosphorus in the crystalline silicon region 103b attracts nickel diffused in the crystalline silicon film 103a. As a result, the concentration of nickel in the masked regions of the crystalline silicon film 103a is markedly reduced. The actual nickel concentration in the masked regions of crystalline silicon film 103a was measured according to the secondary ion mass spectrometry (SIMS). The measurement result indicates that the nickel concentration was reduced to about $5\times10^4$ atoms/cm$^3$. Incidentally, the nickel concentration in the crystalline silicon film 103a before the above heat treatment step was about $5\times10^{17}$–$1\times10^{18}$ atoms/cm$^3$.

Next, the mask 106 made of a silicon oxide film is removed by etching. As an etchant, a 1:10 buffered hydrofluoric acid (BHF) having sufficient selectivity to the silicon film 103 was used, and wet etching was performed.

Figure 1C:
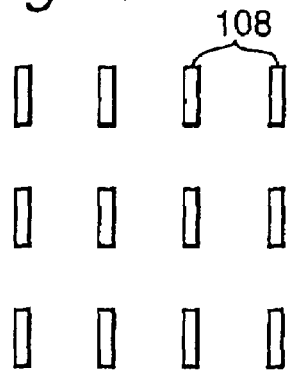
Figure 2D:
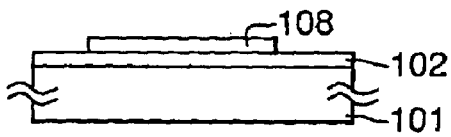

After that, unnecessary portions of the silicon film 103a are removed for isolation of semiconductor devices. That is, in this step, using at least part of the masked regions of the film 103a, island-like crystalline films 108, which are each to become an active region of the TFT (source/drain regions, and a channel region), are formed in the arrangement as shown in FIG. 1B. Thus, the substrate in a state shown in FIGS. 1C and 2D is obtained.

Figure 2E:
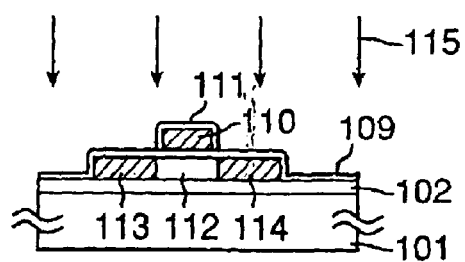

Next, as shown in FIG. 2E, a silicon oxide film having a thickness of 20–150 nm (100 nm here) is formed as a gate insulating film 109 so as to cover the crystalline silicon film 108, which is to become the active region. TEOS was used as a source, and decomposed with oxygen and deposited by the RF plasma CVD method at the substrate temperature of 150–600° C. (preferably 300–450° C.) to form the above silicon oxide film. The above TEOS, a source, may be used with ozone gas, and decomposed with ozone gas and deposited by a low pressure CVD method (alternatively, an atmospheric pressure CVD method) at the substrate temperature of 350–600° C. (preferably 400–550° C.) to form the above silicon oxide film. To improve the bulk characteristics of the gate insulating film 109 itself as well as the interface characteristics between the crystalline silicon film and the gate insulating film, annealing was performed in an inert gas atmosphere at a temperature of 400 to 600° C. for one to four hours.

After that, an aluminum film is deposited by a sputtering method to a thickness of 400 to. 800 mm, for example, 600 nm. The aluminum film is then patterned to form a gate electrode 110. Further, the surface of the aluminum electrode is anodized to form an oxide layer ill. This state corresponds to the state shown in FIG. 2E. The gate electrode 110 and a gate bus line are constituted of the same layer. The plan view of this state is as shown in FIG. 1D. The anodic oxidation was performed in an ethylene glycol solution containing 1 to 5% tartaric acid. At first, the electric voltage was raised to 220 V while keeping the electric current constant. The substrate was held in this state for one hour before the anodic oxidation was terminated. The thickness of the thus formed oxide layer 111 was 200 mm. The thickness of the oxide layer 111 corresponds to an offset gate region to be formed in the ion-doping step performed later. The length of the offset gate region can therefore be determined in the anodic oxidation step.

Next, using the gate electrode 110 and the oxide layer 111 surrounding the gate electrode as a mask, impurities (phosphorus) are doped into the active region by the ion doping method. Using phosphine ($PH_3$) as a doping gas, the acceleration voltage is set at 60 to 90 kV (e.g., 80 kV), and the dose is set at $1\times10^{15}$–$8\times10^{15}$ cm$^{-2}$, (e.g., $2\times10^{15}$ cm$^{-2}$). Regions 113 and 114 doped with the impurities in this step will later become the source and drain regions of the TFT. A region 112, which is masked by the gate electrode 110 and the oxide layer 111 surrounding the gate electrode so that the impurities are not implanted, later becomes the channel region of the TFT.

Figure 2F:
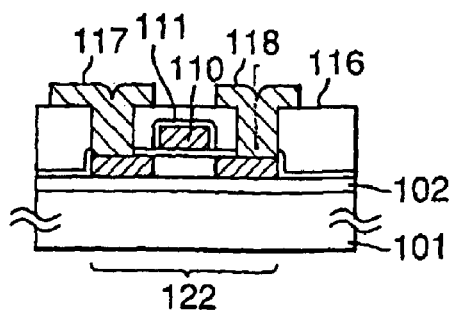

After that, as shown in FIG. 2E, annealing is performed by the irradiation with laser light 115, to activate the impurities introduced by ion implantation as well as to improve the crystallinity at portions damaged by the impurities-introducing step. As the laser, the XeCl excimer laser (a wavelength of 308 nm, a pulse width of 40 nsec) was used, and the irradiation was performed at an energy density of 150–400 mJ/cm$^2$, preferably 200–250 mJ/cm$^2$. The sheet resistance of the N-type impurities (phosphorus) regions 113, 114 thus formed was 200 to 800 subsequently, as shown in FIG. 2F, a silicon oxide film (or silicon nitride film) having a thickness of about 600 nm is formed as an interlayer insulating film 116. When a silicon oxide film is formed by the plasma CVD method using TEOS as a source and oxygen, or by the low-pressure CVD method (or atmospheric pressure CVD method) using TEOS and ozone, the thus formed interlayer insulating layer 116 will be excellent in step coverage. Alternatively, when the interlayer insulating film 116 is provided by a silicon nitride film formed by the plasma CVD method using $SiH_4$ and $NH_3$ as source gases, hydrogen atoms can be fed into the interface between the active region and the gate insulating film. This has an effect of reducing unpaired bonds that degrade the TFT characteristics.

Next, contact holes are formed in the interlayer insulating film 116, and wiring 117 for the source electrode of the TFT is formed from a metallic material (e.g., two-layered film made of titanium nitride and aluminum). The titanium nitride film is provided as a barrier film for preventing aluminum from diffusing in the semiconductor layers. The TFT 122 is a device to switch a pixel electrode. Therefore, the pixel electrode 118 is made of a transparent conductive film such as ITO to connect to the drain electrode. That is, in FIG. 1E, a video signal is provided through the source bus line 117 and electrical charge that is required is applied from the pixel electrode 118 based on a gate signal on the gate bus line 110. Finally, annealing is performed at 350° C. under a pressure of one atm. in a hydrogen atmosphere for 30 minutes to complete the fabrication of the TFT shown in FIGS. 1E and 2F. Further, a protective layer made of a silicon nitride film and the like may be optionally provided on the TFT 122 in order to protect the TFT 122.

The TFTs fabricated by the method according to the embodiment described above exhibited extremely high performance such as the field-effect electron mobility of about 220 cm$^2$/Vs and the threshold voltage of about 1.5 V, and yet the variation in properties inside the substrate was only about ±10% in terms of the electron field-effect mobility and about ±0.2 V in terms of the threshold voltage (using a substrate with a size of 400×320 mm, 30 points in the substrate were measured), which were extremely good. Further, even if durability tests to repetitive measurements, bias and stress attributed to the temperature are conducted, almost no degradation in properties was observed. Thus the TFTs of the embodiment have extremely high reliability. Further, there was no abnormality concerning the increase and variation of the leak current occurring when the TFTs are turned off, which used to be a problem especially when using a catalyst metal. It was possible to reduce the leak current to several pA, which is in the same level as in the case where no metal catalyst is used. Accordingly, the yield was markedly improved. Active matrix boards for liquid crystal display devices fabricated based on this embodiment were evaluated by actual lighting. As a result, high-quality liquid crystal panels having less unevenness in displays, extremely few defects in pixels due to the leakage of the TFTs, and high contrast ratio, compared with those TFTs fabricated by the conventional method, were obtained. Incidentally, although the steps for fabricating TFTs according to this embodiment have been explained targeting pixels of active matrix substrates, the TFTs of the present invention can be easily applied to thin film integrated circuits and the like. In such a case, contact holes are formed also on the gate electrodes 110 and necessary interconnections may be provided.

[Second Embodiment]

Next, referring to FIG. 3 and FIGS. 4A–4F, a second embodiment of the present invention will be described. The production method according to the second embodiment is applied to the steps of fabricating on a quartz glass substrate a CMOS circuit in which N-type TFTs and P-type TFTs are formed complementarily. These TFTs will constitute peripheral drive circuits of active matrix type liquid crystal display devices and general thin film integrated circuits.

FIG. 3 is a plan view showing the outline of the TFT fabrication process steps in this second embodiment. FIGS. 4A–4F: are cross-sectional views taken along the line IV—IV of FIG. 3, in which the fabrication steps sequentially proceeds in the order of the figures.

Figure 4A:
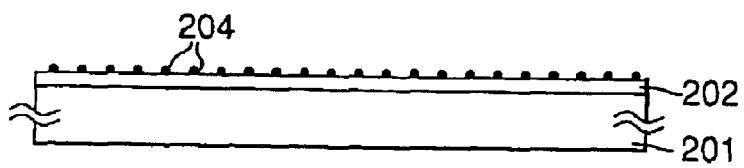
FIGS. 4A, 4B, 4C, 4D, 4E and 4F are sectional views sequentially showing the fabrication steps according to the second embodiment of the present invention.

First, as shown in FIG. 4A, on a quartz glass substrate 201, an undercoat film 202 made of silicon oxide is formed to a thickness of about 300–500 nm by a CVD method. Then, a minute amount of nickel 204 is added to the surface of the undercoat film 202. The addition of the nickel 204 in a minute amount was carried out by holding on the undercoat film 202 a solution in which nickel was dissolved, and uniformly spreading the solution on the substrate 201 using a spinner, followed by drying. In this second embodiment, using nickel acetate as a solute and water as a solvent, the nickel concentration in the solution was adjusted so as to be 10 ppm. In the second embodiment, since the nickel solution is spin-coated on the surface of the undercoat film 202 made of a silicon oxide film of which the surface is hydrophilic, a stable treatment is realized without any particular cares. If the nickel solution is spin-coated on an a-Si film as in the first embodiment, one must be careful about the solvent or the surface state of the a-Si film because the surface of the a-Si film is hydrophobic.

The concentration of the nickel thus added to the surface of the undercoat film 202 was measured by the total reflection of X-ray fluorescence analysis (TRXRF) method, and found to be about $5 \times 10^{12}$ atoms/cm$^2$.

Figure 4B:
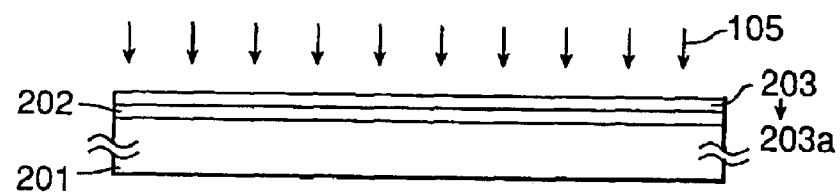

Next, as shown in FIG. 4B, an intrinsic (I type) a-Si film 203 having a thickness of 20–60 nm. (e.g., 30 nm) is formed. At this time, the temperature at which the substrate is heated is preferably not higher than 400° C. In the second embodiment, it was 300° C. Further, as the CVD system, a parallel plate plasma CVD system was used, and SiH$_4$ and H$_2$ gases were used as source gases. Then, the power density of RF power was set in the relatively low range of 10–100 mW/cm$^2$ (e.g., 80 mW/cm$^2$). The deposition rate at this time was about 50 nm/minute. The concentration of hydrogen in the a-Si film 203 thus obtained was 10–15 atomic %.

Then, heat treatment is carried out in an inert atmosphere (e.g., a nitrogen atmosphere). In the heat treatment, dehydrogenation treatment in the a-Si film was first carried out in the middle of temperature rising, and then the crystallization of the a-Si film was carried out at a higher temperature. Specifically, as the first step in the heat treatment, annealing is performed at a temperature of 450–520° C. for one to two hours, and as the second step in the heat treatment, annealing is performed at a temperature of 520–570° C. for two to eight hours. As one example, the heat treatment was first carried out at 500° C. for one hour, and then the heat treatment was carried out at 550° C. for four hours. In the heat treatment, the silicification of nickel 204 present on the surface of the undercoat film 202, namely the undersurface of the a-Si film 203, takes place. The crystallization of the a-Si film 203 proceeds from the silicified nickel as nuclei. However, since the amount of the catalyst element is not sufficient for the complete crystallization of the a-Si film 203, the crystal growth stops at a certain point. At a temperature of not higher than 570° C., the spontaneous crystal growth of the silicon film does not take place. Therefore, the silicon film in uncrystallized regions where the crystal growth is not reached remains amorphous. As a result, the silicon film obtained after the four-hour heat treatment at 550° C. according to the second embodiment is in a state where amorphous regions and crystallized regions are mixed. Specifically, the state as shown in FIG. 7B is obtained. At this time, the area ratio of amorphous regions to the whole silicon film was about 30%. Further, the size of the individual amorphous regions was max. 2 μm. Furthermore, the average grain size of the individual crystal grains in the crystallized regions was about 1–1.5 μm.

Next, as shown in FIG. 4B, by the irradiation of the silicon film 203 with laser light 205, the silicon film 203 is further crystallized to obtain a crystalline silicon film 203a. At this time, a XeCl excimer laser (a wavelength of 308 nm, a pulse width of 40 nsec) was used as the laser light. The irradiation conditions of the laser light were as follows: the substrate was heated to 200–450° C. (400° C. in this case) and then irradiated at an energy density of 200–450 mJ/cm$^2$ (350 mJ/cm$^2$ in this case). The laser was designed so that the beam size on the surface of the substrate 201 would be 150 mm×1 mm in an elongated shape. Scanning was performed sequentially at a step width of 0.05 mm in a direction perpendicular to the longitudinal direction of the laser beam. This means that, in one optional point on the silicon film 203, laser irradiation was conducted 20 times in total. By the laser irradiation, amorphous regions remaining in the silicon film are fused, and the whole film is crystallized reflecting only good crystal components in the crystallized regions.

Figure 4C:
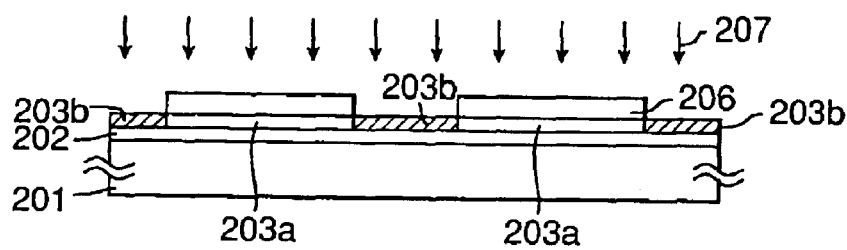

Next, as shown in FIG. 4C, an insulating thin film such as a silicon oxide or silicon nitride film is deposited on the crystalline silicon film 203a. Then patterning is performed to form a mask 206. In the example of the second embodiment, a silicon oxide film was used as the mask 206. To form the mask 206, TEOS as a source was decomposed with oxygen and deposited by the RF plasma CVD method. The thickness of the mask 206 is preferably from 100–400 nm. In the example of the second embodiment, the thickness of the silicon oxide film was set 150 nm. When seen from above, the substrate is in a state where parts of the crystalline silicon film 203a are covered by the mask 206 in an island manner, as shown in FIG. 2C.

Next, in this state, as shown in FIG. 4C, ion doping is performed with phosphorus 207 on the whole surface of the substrate 201 from above. At this time, the doping conditions of the phosphorus 107 are as follows: an acceleration voltage of 5–10 kV and a dose of $5 \times 10^{15}$ –$1 \times 10^{16}$ cm$^{-2}$. In this step, phosphorus is implanted in exposed regions of the crystalline silicon film 203a, whereby phosphorus-doped crystalline silicon regions 203b are formed. On the other hand, the regions covered by the mask 206 in the crystalline silicon film 203 are not doped with phosphorus. When seen from above, the state of the substrate is as shown in FIG. 3. In FIGS. 3 and 4C, the hatched portions indicate the doped regions 203b. Further, in FIG. 3, future TFT active regions 208 (208n, 208p) are shown in broken line in order to make clear the relationship among the future TFT regions, the regions of the silicon film 203a covered by the mask 206, and the phosphorus-implanted regions 203. The crystalline silicon film portions corresponding to the TFT active regions 208 to be formed later are completely covered by the mask 206 at this stage.

In this state, the substrate is subjected to heat treatment in an inert atmosphere (e.g., a nitrogen atmosphere) at a temperature of 580–650° C. for several hours to several tens hours. In the example of the second embodiment, the heat treatment was conducted at 600° C. for 12 hours. In this heat treatment, phosphorus implanted in the crystalline silicon regions 203b attracts nickel diffused in the crystalline silicon film 203a. As a result, the concentration of nickel in the masked regions of the crystalline silicon film 203a is markedly reduced. The actual nickel concentration in the crystalline silicon film 203a was measured by the secondary ion mass spectrometry (SIMS). The measurement results indicate that the nickel concentration was reduced to about $5 \times 10^6$ atoms/cm$^3$.

Next, the silicon oxide film 206 that was used as the mask is removed by etching. As an etchant, a 1:10 buffered hydrofluoric acid (BHF) having sufficient selectivity to the silicon film 203 was used, and wet etching was performed.

Figure 4D:
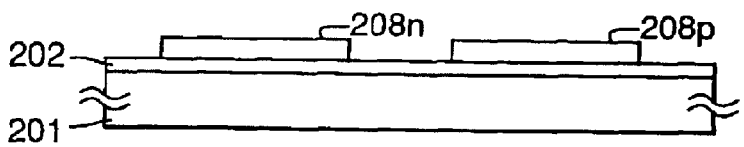

After that, unnecessary portions of the silicon film 203a are removed for isolation of semiconductor devices. That is, in this step, using at least part of the masked regions of the film 203a, island-like crystalline films 208n, 208p, which are each to become an active region of the TFT (source/drain regions, and a channel region), are formed in the arrangement as shown in FIG. 3. As a result, the substrate in a state shown in FIGS. 3 and 4D is obtained.

Figure 4E:
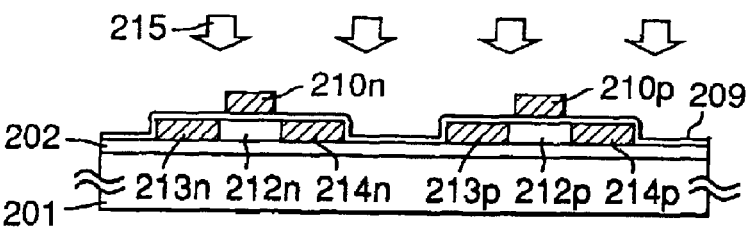

Next, as shown in FIG. 4E, a silicon oxide film having a thickness of 60 nm is formed as a gate insulating film 209 so as to cover the crystalline silicon films 208n, 208p which are to become the active regions of the TFTs. In the second embodiment, TEOS is used as a source, and decomposed with oxygen and deposited by the RF plasma CVD method at the substrate temperature of 150–600° C., preferably 300–450° C., to form the gate insulating film 209. Alternatively, the above TEOS as a source may be decomposed with ozone gas and deposited by the low pressure CVD method (alternatively the atmospheric pressure CVD method) at the temperature of the substrate of 350–600° C. (preferably 400–550° C.) to form the gate insulating film 209. After forming the gate insulating film 209, annealing is performed in an inert gas atmosphere at a temperature of 400 to 600° C. for one to four hours to improve the bulk characteristics of the gate insulating film 209 itself as well as the interface characteristics between the crystalline silicon film and the gate insulating film.

Subsequently, an aluminum film (containing 0.1–2% silicon) is deposited by the sputtering method to a thickness of 400 to 800 nm (e.g., 500 nm), and then the aluminum film is patterned to form gate electrodes 210n, 210p.

Next, using the gate electrodes 210n, 210p as masks, impurities (phosphorus and boron) are implanted in the active regions 208n, 208p, respectively, by the ion doping method. Phosphine ($PH_3$) and diborane ($B_2H_6$) are used as doping gases. The acceleration voltage is set at 60 to 90 kV (e.g., 80 kV) in the former case and 40 to 80 kV (e.g., 65 kV), and the dose is set at $1\times10^{15}$–$8\times10^{15}$ cm$^{-2}$ (e.g., $2\times10^{15}$ cm$^{-2}$ of phosphorus, $5\times10^{15}$ cm$^{-2}$ of boron). In this doping step, the regions masked by the gate electrodes 210n, 210p and into which impurities are not implanted will later become channel regions 212n, 212p of the TFTs. In the doping mentioned above, with those regions requiring no doping covered with a photoresist, selective doping of each element (impurities) is performed. As a result, N-type impurity regions 213n and 214n, and P-type impurity regions 213p and 214p are formed.

After that, as shown in FIG. 4E, annealing is performed by the irradiation with laser light 215, to activate the impurities that have been introduced by ion implantation. As the laser light, a XeCl excimer laser (a wavelength of 308 nm, a pulse width of 40 nsec) is used. The irradiation is performed at an energy density of 250 mJ/cm$^2$, and the individual portions are irradiated with 20 shots each of the laser light.

Figure 4F:
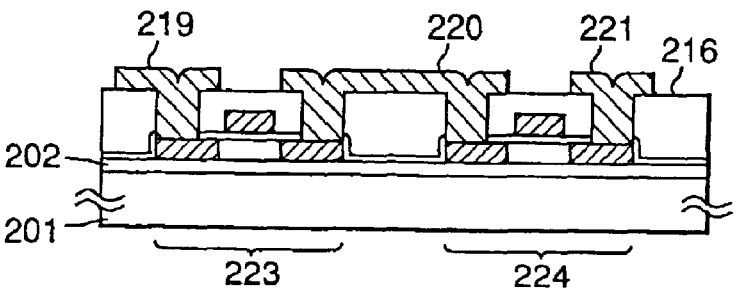
Figure 5:
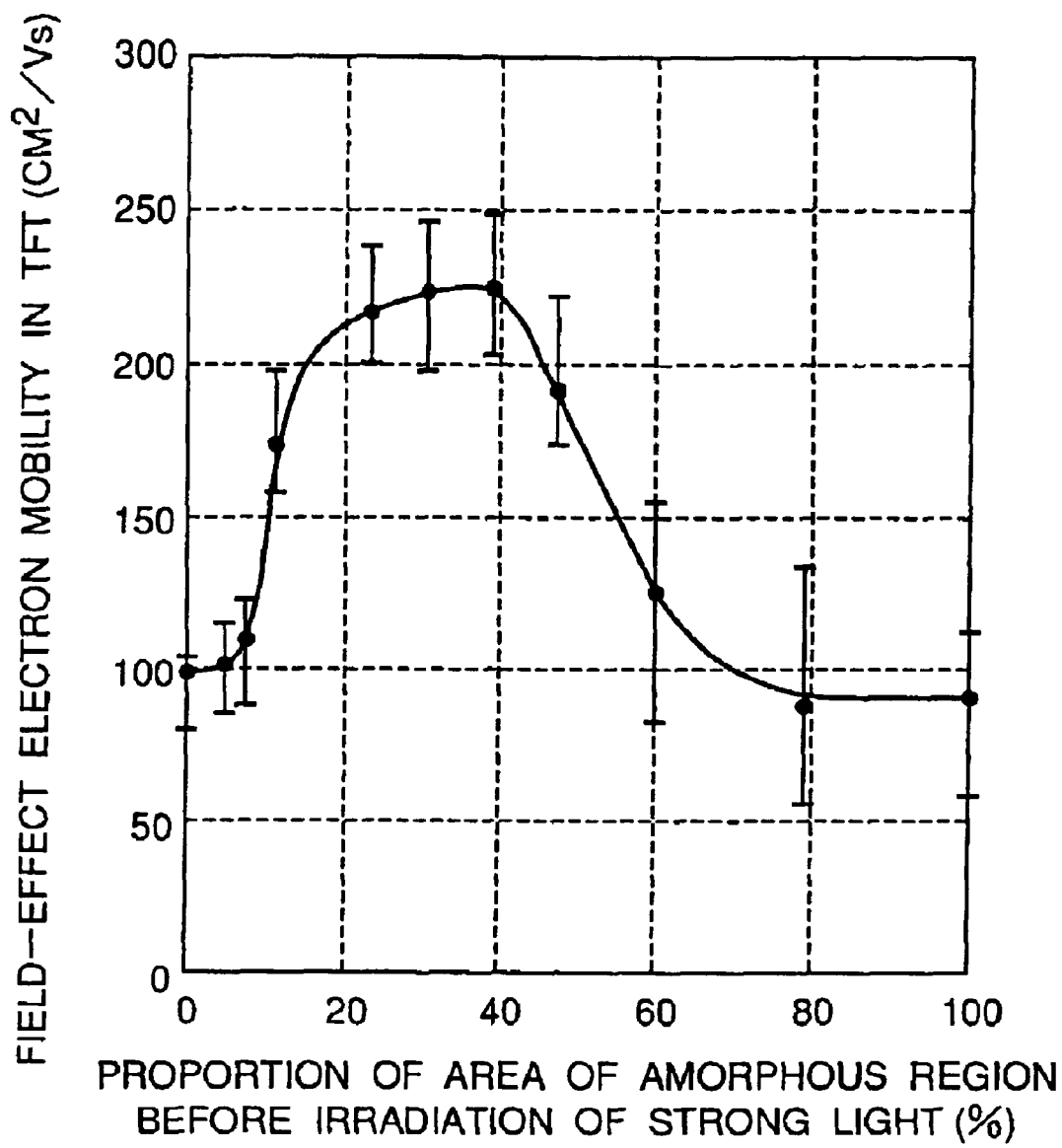
FIG. 5 is a characteristic graph showing the relationship between the proportion of area of the remaining amorphous region and the field-effect electron mobility in TFTs.
Figure 6:
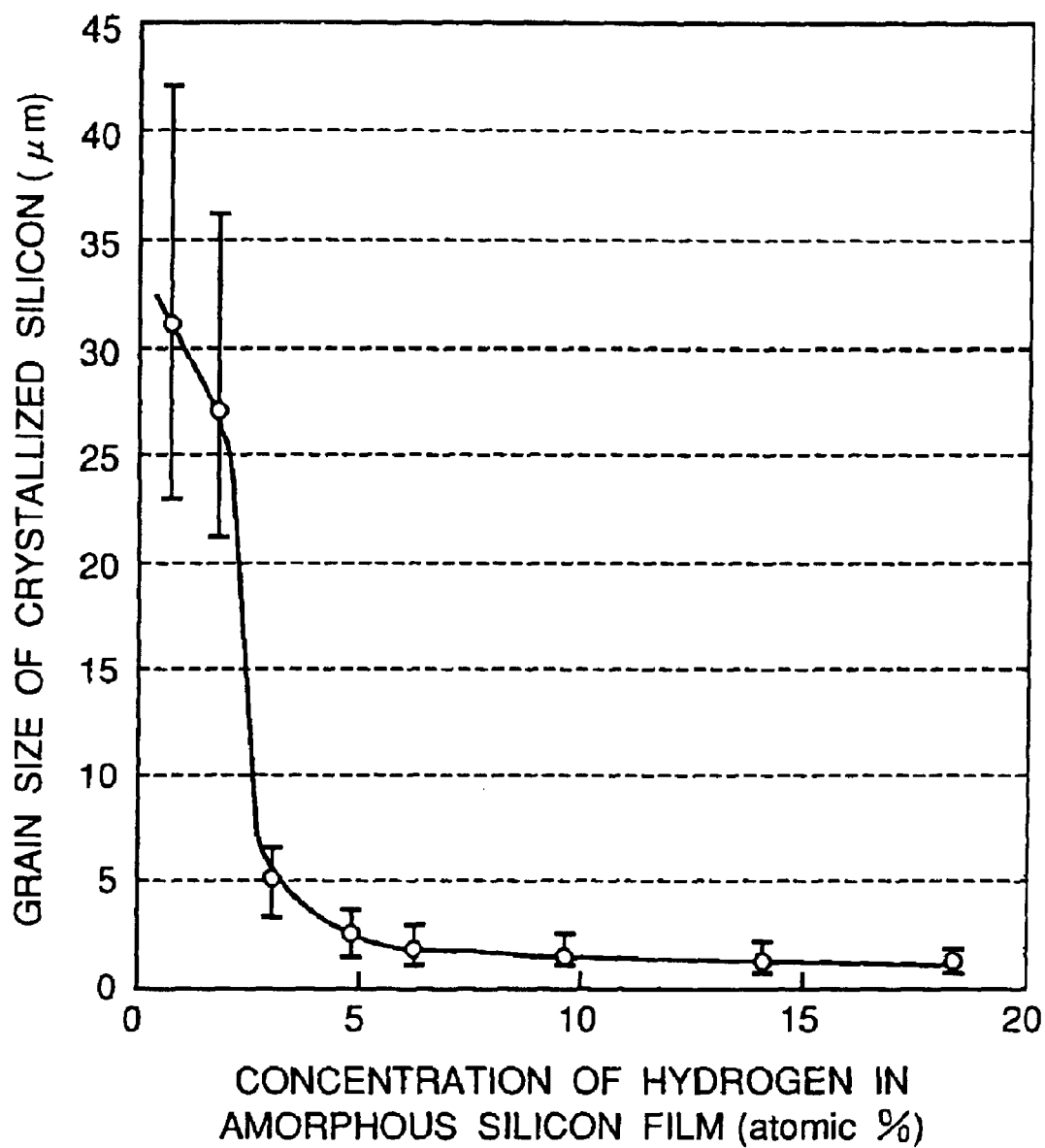
FIG. 6 is a characteristics graph showing the relationship between the concentration of hydrogen in the amorphous silicon (a-Si) film and the grain size of crystallized silicon.

Subsequently, as shown in FIG. 4F, a silicon oxide film having a thickness of about 900 nm is formed as an interlayer insulating film 216 by the plasma CVD method. Then, contact holes are formed in the interlayer insulating film 216, and electrode wirings 219, 220, 221 of the TFTs are formed from a metallic material (e.g., a two-layered film made of titanium nitride and aluminum). Finally, annealing is performed at 350° C. in a hydrogen atmosphere under one atm for one hour to complete an N-channel type TFT 223 and a P-channel type TFT 224. Further, a protective layer made of a silicon nitride film and the like may be optionally provided in order to protect the TFTs 223, 224.

In the CMOS-structured circuit fabricated according to the embodiment described above, the TFT electron field-effect mobility was in the range of as high as 210–250 cm$^2$/Vs in the case of N-type TFTs, and as high as 120–150 cm$^2$/Vs in the case of P-type TFTs. The threshold voltage of each TFT was about 1.5 V in the case of N-type TFTs, about –2.0 V in the case of P-type TFTs. In short, the TFTs in the circuit exhibited good properties.

Variation in properties, which had been a problem when catalyst elements were used, was suppressed to about ±10% in the electron field-effect mobility, and to about ±0.2 V in the threshold voltage (which are results of measurements at 30 points of a substrate of a size of 400×320 mm). Thus, stable circuit properties were exhibited.

The two embodiments of the present invention have specifically been described above. However, it should not be construed that the present invention is limited to the above embodiments, and various modifications may be made based on the technical concepts of the present invention.

For example, the above two embodiments adopt a technique of spin-coating the surface of the a-Si film or of the undercoat film with an aqueous solution in which a nickel salt is dissolved, as the method of introducing nickel. However, various other methods of introducing nickel may be employed. For example, the following methods are available: a method of diffusing nickel from a $SiO_2$ film using SOG (spin on glass) material as a solvent; a method of directly introducing nickel by ion doping technique; a method of forming an extremely thin nickel film by vapor deposition or metal plating technique though the control is difficult; and the like. Furthermore, besides nickel, as the impurity metal element promoting crystallization, cobalt, palladium, platinum, copper, silver, gold, indium, tin, aluminum and/or antimony may be used. With use of any of those elements, similar effects are obtained.

Further, as the means of further crystallizing a partially crystallized silicon film by the irradiation with strong light, XeCl excimer laser light having a wavelength of 308 nm was used. Alternatively, KrF excimer laser light having a wavelength of 248 nm or ArF excimer laser light having a wavelength of 198 nm is similarly effective. Besides these pulse lasers, continuous oscillation Ar laser and the like are also applicable. Further, so-called RTA (rapid thermal anneal), which is also called "RTP" (rapid thermal process), in which the temperature is raised to 1000–1200° C. (which are temperatures indicated by the silicon monitor) in a short period of time so as to heat a sample, using an infrared light, a flash lamp, or other strong light, in place of the laser light, that has intensity equal to the intensity of the laser light.

Further, as the application of the present invention besides active matrix type substrates for liquid crystal display devices, for example, a contact image sensor, a driver built-in type thermal head, a driver built-in type optical recording or display device using organic EL and the like as a light emitting element, a three-dimensional IC and the like are conceivable. By using the present invention, high performance such as high speed and high resolution of these devices is realized. Furthermore, the present invention can widely be applied to the general semiconductor process for semiconductor devices including bipolar transistors and electrostatic induction transistors using crystalline semiconductors as device materials.

As is apparent from the description as above, by using the present invention, stable high-performance semiconductor elements having less variation in properties can be realized. Also, high-performance semiconductor devices with high integration degree are obtained by a simple production process. Further, in the production steps, the non-defective rate of devices can greatly be improved. Thus, the reduction in cost of products is possible. Particularly in liquid crystal display devices, an improvement in switching properties of pixel switching TFTs, which is required of active matrix boards, and a high performance and high integration degree, which are required of TFTs constituting peripheral drive circuits, are satisfied at the same time. Thus, it is possible to realize a driver monolithic type active matrix board in which an active matrix portion and a peripheral drive circuit portion are formed on an identical substrate. Therefore, a compact, high-performance, and low-cost module is achievable.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of producing a semiconductor device comprising:

an element adding step of adding to an amorphous silicon film a catalyst element or elements serving to promote crystallization of the amorphous silicon film, said amorphous silicon film being formed on a substrate having an insulating surface;

a first crystalization step of subjecting the amorphous silicon film to heat treatment to cause crystal growth of the amorphous silicon film, said crystal growth being stopped in a state that minute amorphous regions remain, a second crystallization step of irradiating the amorphous silicon film, of which the crystal growth has been stopped in a state that minute amorphous regions remain, with a strong light to cause further crystallization; and wherein in the second crystallization step, the irradiation of the strong light is performed at an intensity which allows the amorphous regions to be crystallized reflecting the crystallinity of the crystallized regions, but which does not allow an original crystallinity of the crystallized regions to be lost.

2. The method of producing a semiconductor device according to claim 1, wherein the crystal growth in the first crystallization step is controlled by an amount of catalyst element or elements to be added to the surface of the amorphous silicon film.

3. The method of producing a semiconductor device according to claim 2, wherein the amount of catalyst element or elements to be added to the surface of the amorphous silicon film is $1\times10^{12}$–$1\times10^{13}$ atoms/cm$^2$ in terms of a surface concentration.

4. The method of producing a semiconductor device according to claim 1, wherein a ratio of areas in a plane of the minute amorphous regions obtained after the first crystallization step to the whole silicon film is 10%–50%.

5. The method of producing a semiconductor device according to claim 4, wherein the ratio of areas in a plane of the minute amorphous regions obtained after the first crystallization step to the whole silicon film is 20%–40%.

6. The method of producing a semiconductor device according to claim 1, wherein the silicon film obtained after the first crystallization step has the minute amorphous regions interspersed with crystalized regions thereof, and the individual amorphous regions have a planar size of 5 μm or less.

7. The method of producing a semiconductor device according to claim 1, wherein the crystallized regions of the silicon film obtained after the first crystallization step are composed of polycrystalline silicon of which crystal grains each have a grain size of 5 μm or less.

8. The method of producing a semiconductor device according to claim 1, wherein said amorphous silicon film contains hydrogen and a concentration of hydrogen in this film is 3–15 atomic %.

9. The method of producing a semiconductor device according to claim 8, wherein the amorphous silicon film containing hydrogen is formed by a plasma CVD method using a heating temperature of 400° C. or below.

10. The method of producing a semiconductor device according to claim 1, wherein the heat treatment in the first crystallization step is carried out at a temperature at which there occurs no spontaneous generation of crystal nuclei derived from the amorphous silicon film itself, but occurs generation of crystal nuclei derived only from the catalyst element or elements, and at which the crystal growth proceeds only with the aid of the catalyst element or elements.

11. The method of producing a semiconductor device according to claim 10, wherein the temperature of the heat treatment in the first crystallization step is set in a range of 520°C.–570°C.

12. The method of producing a semiconductor device according to claim 1, wherein the second crystallixation step comprises performing the irradiation using, as the strong light, an excimer laser light having a wavelength of 400 nm or less so that an energy density at a surface of the silicon film is 200–450 ml/cm$^2$.

13. The method of producing a semiconductor device according to claim 1, wherein at least nickel is used as a catalyst element to promote the crystallization of the amorphous silicon film.

14. The method of producing a semiconductor device according to claim 1, further comprising, after the second crystallization step, a catalyst element-migrating step of causing most of atoms of the catalyst element or elements remaining in the silicon film to migrate to regions other than an active region of the semiconductor device.

* * * * *